United States Patent
Wei et al.

(10) Patent No.: US 6,506,654 B1
(45) Date of Patent: Jan. 14, 2003

(54) SOURCE-SIDE STACKING FAULT BODY-TIE FOR PARTIALLY-DEPLETED SOI MOSFET HYSTERESIS CONTROL

(75) Inventors: Andy C. Wei, Asutin, TX (US); Witold P. Maszara, Morgan Hill, CA (US); Mario Pelella, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/105,486

(22) Filed: Mar. 26, 2002

(51) Int. Cl.$^7$ ............................................. H01L 21/336
(52) U.S. Cl. ........................ 438/307; 438/528; 438/301
(58) Field of Search ................... 438/166, 307, 438/528, 301, 244, 204, 207, 221, 151, 150, 154, 162, 305, 524, 636, 303, 304, 306; 257/347, 301

(56) References Cited

U.S. PATENT DOCUMENTS

| | | | | |
|---|---|---|---|---|
| 4,317,686 A | * | 3/1982 | Anand et al. ........ | 148/DIG. 77 |
| 4,879,585 A | * | 11/1989 | Usami ........................ | 257/288 |
| 5,008,723 A | * | 4/1991 | van der Have ............. | 257/386 |
| 5,593,907 A | * | 1/1997 | Anjum et al. ............... | 438/298 |
| 5,698,869 A | * | 12/1997 | Yoshimi et al. ............. | 257/192 |
| 5,753,560 A | * | 5/1998 | Hong et al. .................. | 438/162 |
| 5,811,283 A | * | 9/1998 | Sun ............................ | 438/155 |
| 5,895,956 A | * | 4/1999 | Oowaki et al. ............. | 257/350 |
| 5,972,762 A | * | 10/1999 | Wu ............................. | 438/305 |
| 5,994,747 A | * | 11/1999 | Wu ............................. | 257/344 |
| 6,118,152 A | * | 9/2000 | Yamaguchi et al. ........ | 257/347 |
| 6,130,139 A | * | 10/2000 | Ukeda et al. ............... | 438/353 |
| 6,130,461 A | * | 10/2000 | Oowaki et al. ............. | 257/369 |
| 6,249,017 B1 | * | 6/2001 | Togo .......................... | 257/296 |
| 6,271,070 B2 | * | 8/2001 | Kotani et al. ............... | 438/207 |
| 6,281,054 B1 | * | 8/2001 | Yeo ............................. | 257/347 |
| 6,287,900 B1 | * | 9/2001 | Yamazaki et al. .......... | 438/151 |
| 6,313,014 B1 | * | 11/2001 | Sakaguchi et al. ......... | 257/347 |
| 6,348,390 B1 | * | 2/2002 | Wu ............................. | 257/396 |
| 6,362,063 B1 | * | 3/2002 | Maszara et al. ............ | 438/307 |
| 6,403,433 B1 | * | 6/2002 | Yu et al. ..................... | 438/162 |
| 6,420,218 B1 | * | 7/2002 | Yu ............................. | 438/142 |
| 6,432,785 B1 | * | 8/2002 | Wu ............................. | 438/305 |

* cited by examiner

*Primary Examiner*—Chandra Chaudhari
*Assistant Examiner*—Laura M Schillinger

(57) ABSTRACT

Floating body effects are substantially reduced by strategically forming source-side stacking faults to create a leakage path from the body to the source of an SOI structure. Embodiments include ion implanting a heavy ion, such as Xe, to form a buried amorphous layer in the source-side of the silicon layer after source/drain implants followed by silicidation, during which the buried amorphous region recrystallizes creating source-side stacking faults.

11 Claims, 4 Drawing Sheets

SOURCE-SIDE STACKING FAULT BODY-TIE FOR PARTIALLY-DEPLETED SOI MOSFET HYSTERESIS CONTROL

FIELD OF THE INVENTION

The present invention relates generally to manufacturing semiconductor devices, particularly highly miniaturized semiconductor devices having ultra-shallow junction depths. The present invention is particularly applicable to manufacturing highly reliable SOI MOSFETS.

BACKGROUND ART

Semiconductor manufacturing techniques undergo constant challenges as design features continue to plunge deeper into the submicron regime, as in fabricating devices having a design rule of about 0.12 micron and under. The accurate formation of ultra-shallow junction depths ($X_j$) having high reliability in an efficient manner poses a particularly challenging problem.

Preamorphization techniques, as by ion implanting silicon (Si) or germanium (Ge), to define the contours of source/drain regions prior to dopant implantation and annealing have been employed to reduce the channeling effect and reduce transient enhanced diffusion (TED), and to reduce the activation temperature. Such preamorphization (SPE) techniques, however, are not without disadvantageous consequences. For example, implanted Si and Ge ions tend to migrate beyond the intended source/drain regions resulting in what is referred to as implantation straggle, both vertically and horizontally, making it extremely difficult to precisely define ultra-shallow source/drain extensions, e.g., below 400 Å.

As the design rules plunge into the deep sub-micron range, the channel length, i.e., distance between junctions across the channel, evolves as a critical dimension, particularly as the channel length is reduced to about 1,000 Å and under. Natural variations in junction position as well as variations arising from processing render it difficult to accurately design devices. Alteration of a doping profile from TED as well as implantation straggle exacerbate design problems.

Conventional silicon-on-insulator (SOI) types of substrates have evolved and basically comprise a substrate, a buried oxide layer thereon, and a semiconductor layer on the buried oxide layer which constitutes the "body" of the transistor. In such SOI devices, the body floats in that there is no direct electrical connection to it. As the source and drain regions are isolated from the substrate, junction capacitance is reduced, i.e., when an electrical signal changes on either or both source and drain, there is significantly less capacitive coupling to the substrate. As electrical isolation is facilitated employing an SOI substrate, certain electrical elements of the circuit can be positioned closer together, thereby reducing the die size. SOI structures also offer the advantage of more rapid switching. In addition, latchup, which typically occurs in standard CMOS devices, does not exist employing SOI substrates, since the substrate is isolated by the buried oxide. Static or plasma arcing is also reduced in SOI devices.

There are, however, disadvantages attendant upon employing SOI substrates in fabricating semiconductor devices. A notable disadvantage is what is referred to as "floating body effects". For example, it takes a considerable period of time for an ejected charge to leak out. As a result, transient bipolar effects can occur wherein a parasitic bipolar transistor turns on parallel to the MOSFET. In addition, hysteresis effects occur.

There exists a need for efficient methodology enabling the fabrication of semiconductor devices having accurate ultra-shallow junctions. There exists a particular need for efficient methodology enabling the fabrication of semiconductor devices having accurate ultra-shallow junctions based upon SOI substrates without floating body effects.

DISCLOSURE OF THE INVENTION

An advantage of the present invention is a method of manufacturing a semiconductor device having an SOI structure with reduced floating body effects.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a silicon-on-insulator (SOI) structure comprising: a lower silicon substrate; a buried insulating layer on the substrate; and an upper layer of crystalline silicon on the insulating layer; forming a gate electrode, having an upper surface and side surfaces, on the upper silicon layer with a gate dielectric layer therebetween; ion implanting dopant impurities to form source extensions and source regions in the upper silicon layer on a source-side thereof and to form drain extensions and drain regions in the upper silicon layer on a drain-side thereof; implanting ions into the source-side of the upper silicon layer to form a buried amorphous region therein while masking the drain-side of the upper silicon layer; and recrystallizing the buried amorphous region leaving source-side stacking faults.

Embodiments of the present invention comprise forming an SOI structure with a silicon oxide buried insulating layer, ion implanting Xe or a heavier ion at an implantation dosage of about $80 \times 10^{13}$ to about $1.2 \times 10^{14}$ ions/cm$^2$ and an implantation energy of about 70 KeV to about 150 KeV, to form the buried amorphous region extending from below the upper surface of the upper silicon layer across about 50% to about 80%, e.g., about 80%, of the upper silicon layer. A metal, such as cobalt (Co) is then deposited and silicidation implemented, as at first and second stages, with a second stage at a temperature of about 700° C. to about 800° C. to form cobalt silicide layers. During such silicidation annealing, the buried amorphous region is crystallized leaving the source-side stacking faults and the source/drain implants are activated.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention addresses and solves or substantially alleviates floating body effects in SOI structures by strategically forming source-side stacking faults to provide a leakage path from the body to the source, thereby improving hysteresis control. Embodiments of the present invention comprise ion implanting heavy ions into the upper silicon layer after formation of the source/drain regions, in the source-side of the upper silicon layer, prior to silicidation. Embodiments of the present invention comprise ion implanting a heavy ion, such as xenon (Xe) into the source-side of the upper silicon layer to form a buried amorphous region, while masking the drain-side of the upper silicon layer. Implantation dosages and energies are controlled to form the buried amorphous region extending from below the upper surface of the upper silicon layer downward across about 50% to about 80%; e.g., about 80%, of the upper silicon layer, which upper silicon layer typically has a thickness of about 700 Å to about 1,000 Å. For example, upon forming an upper silicon layer having a thickness of about 900 Å, implantation conditions may be adjusted to form the buried amorphous region extending from a depth of about 100 Å from the upper surface of the substrate to a depth of about 800 Å from the upper surface of the upper silicon layer. For example, Xe can be ion implanted at a dosage of about $80 \times 10^{13}$ to about $1.2 \times 10^{14}$ ion/cm$^2$ and an implantation energy of about 70 KeV to about 150 KeV. Upon recrystallizing, as at a temperature of above about 600° C., as during second stage Co silicidation, stacking faults are formed across the source region. Such stacking faults are believed to occur as a result of end of range defects formed during ion implantation. Accordingly, the greater the width of the buried amorphous region, the more effective the stacking faults. The resulting source-side stacking faults provide a high leakage path from the body to the source thereby forming an effective body-tie.

Figure 1:
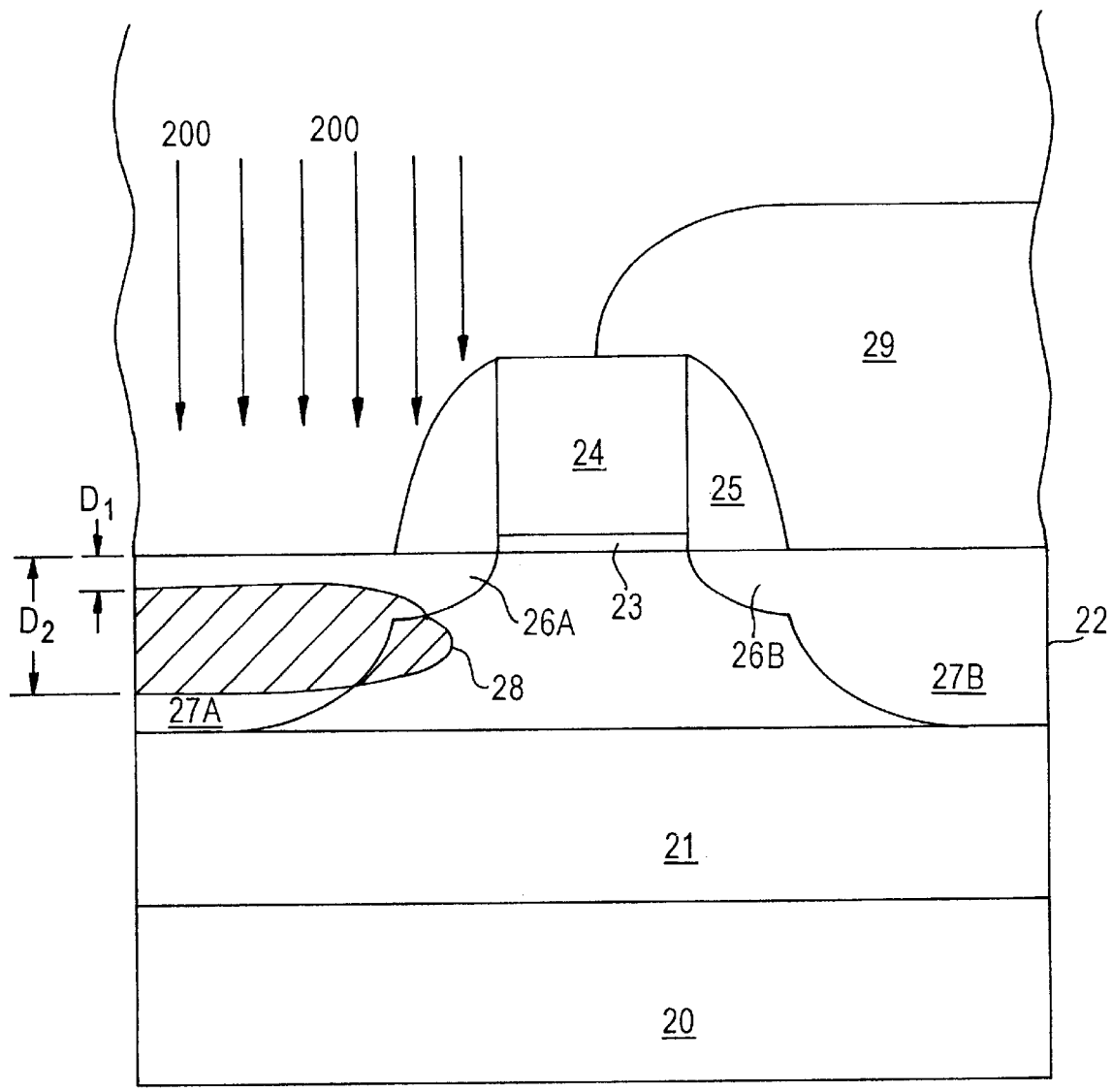
FIGS. 1 and 2 schematically illustrate sequential phases of a method in accordance with an embodiment of the present invention.
Figure 2:
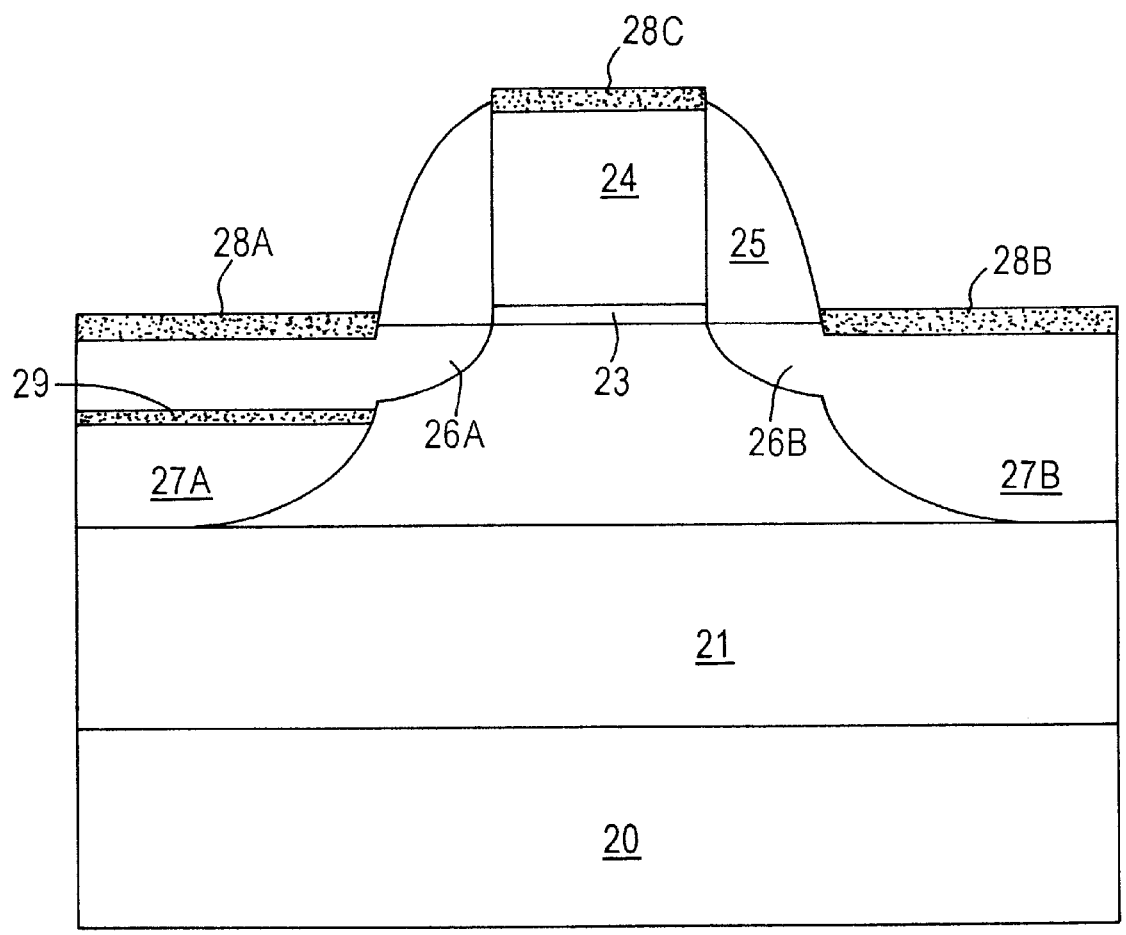

A method in accordance with an embodiment with the present invention is schematically illustrated in FIGS. 1 and 2, wherein similar features or elements are denoted by similar reference numerals. An SOI substrate is formed comprising substrate 20, buried insulation layer 21, such as silicon oxide, and an upper crystalline silicon layer 22. The upper silicon layer 22 typically has a thickness of about 700 Å to about 1,100 Å. A gate electrode 24 is formed on the upper silicon layer 22 with a gate insulating layer 23 therebetween. Shallow source extension 26A and source region 27A are formed in the source-side of the upper silicon layer 22, while a shallow drain extension 26B and drain region 27B are formed in the drain-side of the upper silicon layer 22. Such impurity regions may be formed in a conventional manner, as by initially ion implanting dopant impurities, using the gate electrode 24 as a mask, to form the shallow source/drain extension implants followed by annealing. Subsequently, sidewall spacers 25 are formed on side surfaces of gate electrode 24, and ion implantation is conducted to form source implant 27A and drain implant 27B.

As also schematically illustrated in FIG. 1, a mask 29, such as a photoresist mask, is formed over the drain-side of the upper silicon layer 22 and heavy ions are implanted into the source-side of upper silicon layer 22, as schematically illustrated by arrows 200, e.g., Xe. Implantation conditions are adjusted to form a buried amorphous region 28. For example, when providing an upper silicon layer 22 having a thickness of about 900 Å, buried amorphous region 28 can be formed to extend from a distance $D_1$ of about 100 Å from the upper surface of the upper silicon layer 22 down to a distance $D_2$ of about 800 Å from the upper surface of the upper silicon layer 22.

Subsequently, a metal, such as Co, is deposited and heating is implemented, as at a temperature of about 700° C. to about 800° C. to form metal silicide layers at 28A on the source region, 28B on the drain region and 28C on the upper surface of gate electrode 24, as illustrated in FIG. 2. During such heating to effect silicidation, the buried amorphous region 28 is crystallized leaving source-side stacking faults 29 proximate the mid-point of the source regions and the source/drain regions 27A and 27B activated. Advantageously, by forming source-side stacking faults 29, floating body effects are substantially reduced, thereby enhancing hysterises control.

Another inventive aspect comprises alleviation of SOI floating body effects in strained SOI structures. This inventive aspect comprises creating leaky source or drain-to-body junctions which result in a reduction of floating body voltage. This can be achieved by local relaxation of the strained interface between the strained silicon and underlying film, such SiGe, in the vicinity of the source or drain-to-body regions. Such local defects result in better SOI floating body control. In accordance with an embodiment of this aspect, localized heating and defects can be achieved by laser annealing at the source or drain regions.

Figure 3:
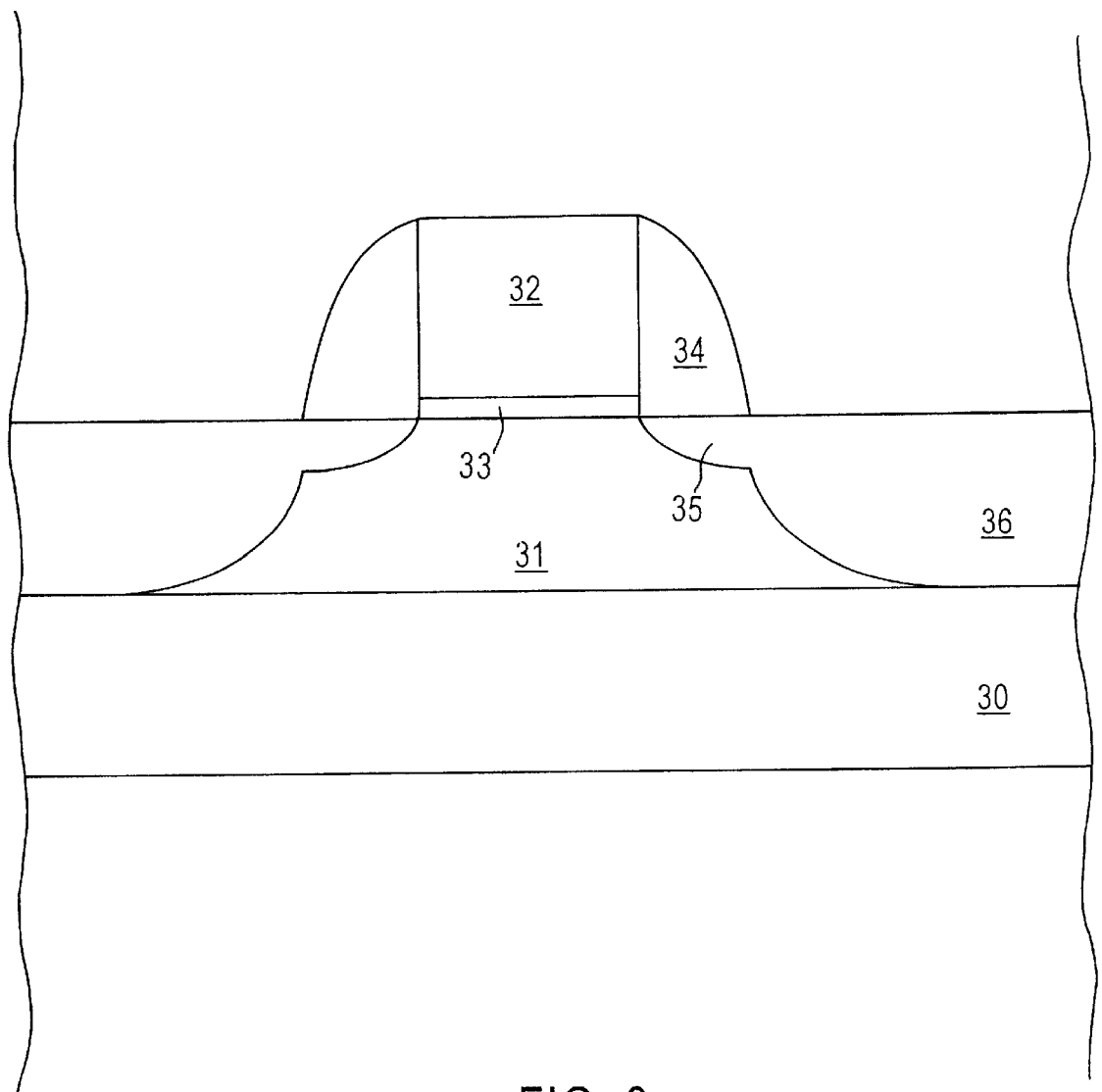
FIGS. 3 and 4 schematically illustrate sequential phases of another inventive aspect.
Figure 4:
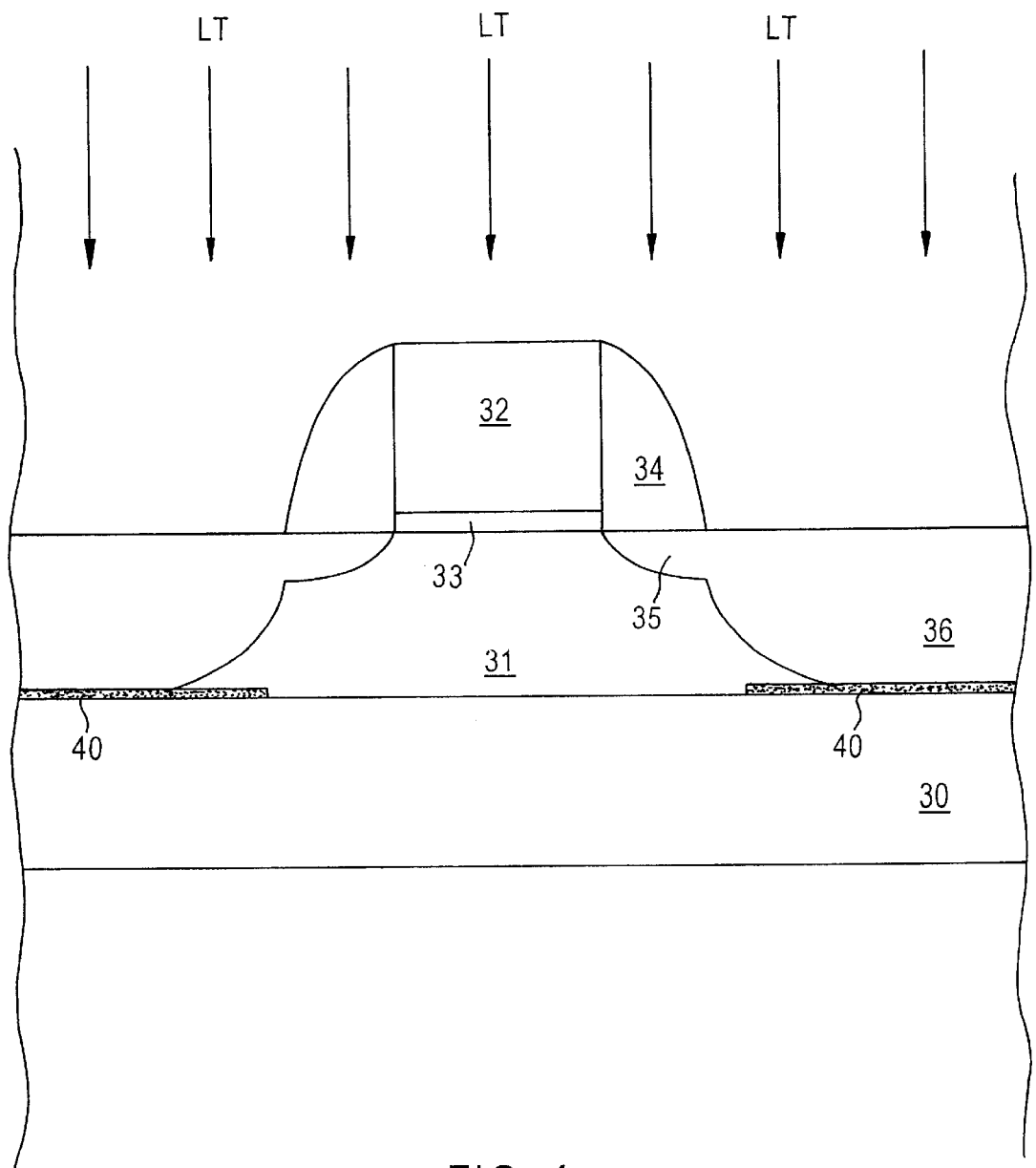

Adverting to FIGS. 3 and 4, wherein similar features or components are denoted by similar reference characters, a strained SOI structure is illustrated comprising SiGe layer 30 strained Si layer 30 and strained Si layer 31 thereon. A gate electrode 32 is formed over layer 31 with a gate dielectric layer 33 therebetween. Sidewall spacers 34 are formed on side surfaces of gate electrode 32. The dopant regions comprise shallow source/drain extensions 35 and deep moderate source/drain regions 36.

Adverting FIG. 4, laser thermal annealing is conducted, as indicated by arrows denoted LT, to relax the strain at the interface between layers 30 and 31, thereby causing local strain relaxation which induces stacking faults on both the source-side and drain-side, which stacking faults are denoted by reference character 40 in FIG. 4. Stacking faults 40 improve floating body control of strained SOI devices by increasing leakage junctions.

The present invention enjoys industrial utility in fabricating various types of semiconductor devices. The present invention is particularly applicable to manufacturing semiconductor devices having submicron features.

In the previous description, numerous specific details are set forth, such as specific materials, structures, chemicals, processes, etc., to provide better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as disclosed herein.

What is claimed is:

1. A method of manufacturing a semiconductor device, the method of comprising:

forming a silicon-on-insulator (SOI) structure comprising:
- a lower silicon substrate;
- a buried insulating layer on the substrate; and
- an upper layer of crystalline silicon on the insulating layer;

forming a gate electrode, having an upper surface and side surfaces, on the upper silicon layer with a gate dielectric layer therebetween;

ion implanting dopant impurities to form source extensions and source regions in the upper silicon layer in a source-side thereof and drain extensions and drain regions in the upper silicon layer in a drain-side thereof;

implanting ions into the source-side of the upper silicon layer to form a buried amorphous region therein while masking the drain-side of the upper silicon layer; and recrystallizing the buried amorphous region leaving source-side stacking faults.

2. The method according to claim 1, wherein the buried insulating layer comprises silicon oxide.

3. The method according to claim 1, comprising ion implanting Xenon (Xe) to form the buried amorphous region.

4. The method according to claim 3, comprising ion implanting Xe at an implantation dosage of about $80 \times 10^{13}$ to about $1.2 \times 10^{14}$ ions/cm$^2$ and an implantation energy of about 70 KeV to about 150 KeV.

5. The method according to claim 3, comprising ion implanting dopant impurities into the upper silicon layer to form source/drain extensions using the gate electrode as a mask;

annealing to activate the source/drain extensions;

forming sidewall spacers on the side surfaces of the gate electrode over the source/drain extensions;

ion implanting dopant impurities into the upper silicon layer to form source/drain regions;

masking the drain-side of the upper silicon layer; and ion implanting Xe to form the buried amorphous region in the source-side of the upper silicon layer.

6. The method according to claim 3, further comprising forming metal silicide layers on the source/drain regions and on the upper surface of the gate electrode.

7. The method according to claim 6, comprising:

depositing a metal layer on the source/drain regions and the upper surface of the gate electrode; and heating to form the metal silicide layers on the source/drain regions and the upper surface of the gate electrode, recrystallize the buried amorphous region creating the source-side stacking faults and activate the source/drain regions.

8. The method according to claim 7, comprising depositing cobalt as the metal layer and heating to form cobalt silicide as the metal silicide layers.

9. The method according to claim 8, comprising heating at a temperature of about 700° C. to about 800° C. to effect silicidation.

10. The method according to claim 1, comprising heating at a temperature greater than about 600° C. to recrystallize the buried amorphous region.

11. The method according to claim 1, comprising ion implanting to form the buried amorphous region across about 50% to about 80% of the thickness of the upper silicon layer.

* * * * *